United States Patent
Hatem et al.

(10) Patent No.: US 7,655,932 B2
(45) Date of Patent: Feb. 2, 2010

(54) TECHNIQUES FOR PROVIDING ION SOURCE FEED MATERIALS

(75) Inventors: Christopher R. Hatem, Cambridge, MA (US); Craig R. Chaney, Rockport, MA (US); Eric R. Cobb, Danvers, MA (US); Joseph C. Olson, Beverly, MA (US); Chris Campbell, Newburyport, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 328 days.

(21) Appl. No.: 11/776,217

(22) Filed: Jul. 11, 2007

(65) Prior Publication Data

US 2008/0169427 A1    Jul. 17, 2008

Related U.S. Application Data

(60) Provisional application No. 60/872,447, filed on Jan. 11, 2007.

(51) Int. Cl.
*H01J 49/10* (2006.01)
*H01J 27/02* (2006.01)

(52) U.S. Cl. .............. 250/492.21; 250/423 R; 250/424; 250/425; 250/426; 315/111.011; 315/111; 315/21; 700/121

(58) Field of Classification Search ........... 250/492.21, 250/423 R, 424, 425, 426; 315/111.01, 111.21; 700/121
See application file for complete search history.

(56) References Cited

U.S. PATENT DOCUMENTS

| 2,882,410 | A | 4/1959 | Brobeck |
| 3,434,894 | A | 3/1969 | Gale |
| 4,845,366 | A | 7/1989 | Hoffman et al. |
| 6,565,002 | B1 | 5/2003 | Tel |
| 2006/0164246 | A1 | 7/2006 | Ghosh |
| 2008/0105828 | A1* | 5/2008 | Hatem et al. ............. 250/426 |
| 2008/0105833 | A1* | 5/2008 | England et al. ....... 250/492.21 |
| 2008/0179545 | A1* | 7/2008 | Perel et al. ........... 250/492.21 |

FOREIGN PATENT DOCUMENTS

| EP | 0080734 B1 | 2/1987 |
| JP | 60 054150 A | 3/1985 |
| WO | 9323869 A1 | 11/1993 |

* cited by examiner

*Primary Examiner*—Nikita Wells

(57) ABSTRACT

Techniques for providing ion source feed materials are disclosed. In one particular exemplary embodiment, the techniques may be realized as a container for supplying an ion source feed material. The container may comprise an internal cavity to be pre-filled with an ion source feed material. The container may also comprise an outer body configured to be removably loaded into a corresponding housing that is coupled to an ion source chamber via a nozzle assembly. The container may further comprise an outlet to seal in the pre-filled ion source feed material, the outlet being further configured to engage with the nozzle assembly to establish a flow path between the internal cavity and the ion source chamber. The container may be configured to be a disposable component.

27 Claims, 7 Drawing Sheets

TECHNIQUES FOR PROVIDING ION SOURCE FEED MATERIALS

CROSS-REFERENCE TO RELATED APPLICATIONS

This patent application claims priority to U.S. Provisional Patent Application No. 60/872,447, filed Jan. 11, 2007, which is hereby incorporated by reference herein in its entirety.

FIELD OF THE DISCLOSURE

The present disclosure relates generally to semiconductor manufacturing and, more particularly, to techniques for providing ion source feed materials.

BACKGROUND OF THE DISCLOSURE

In semiconductor manufacturing, ion implantation is used to change the material properties of portions of a substrate. Indeed, ion implantation has become a standard technique for altering properties of semiconductor wafers during the production of various semiconductor-based products. Ion implantation may be used to introduce conductivity-altering impurities (e.g., dopant implants), to modify crystal surfaces (e.g., pre-amorphization), to created buried layers (e.g., halo implants), to create gettering sites for contaminants, and to create diffusion barriers (e.g., fluorine and carbon co-implant). Also, ion implantation may be used in non-transistor applications such as for alloying metal contact areas, in flat panel display manufacturing, and in other surface treatment. All of these ion implantation applications may be classified generally as forming a region of material property modification.

In a typical doping process, a desired impurity material is ionized, the resulting ions are accelerated to form an ion beam of a prescribed energy, and the ion beam is directed at a surface of a target substrate, such as a semiconductor-based wafer. Energetic ions in the ion beam penetrate into bulk semiconductor material of the wafer and are embedded into a crystalline lattice of the semiconductor material to form a region of desired conductivity.

An ion implanter system usually includes an ion source for generating ions. Associated with the ion source may be a supply mechanism that supplies an ionizable gas into an ion source chamber or other ionizer. The ionizable gas is obtained either directly from a gaseous feed material (e.g., a canister of compressed gas or safe delivery system (SDS)) or indirectly from a solid feed material that has been vaporized in a vaporizer crucible. In either case, it is desirable that the feed material be of a consistently high quality to ensure repeatable ion generation results.

A number of factors may affect the quality of a feed material. For example, a feed material may become contaminated during storage or transportation. If the feed material has been exposed to atmosphere, moisture or other contaminants may be introduced. Some feed materials may deteriorate over time and cannot be safely used or re-used after a designated period of time. Some feed materials are shipped with co-fillers or additives which can also become contaminated. When a non-gaseous feed material is supplied from a vaporizer, internal surface properties of the vaporizer may also contribute to the deterioration or contamination of the feed material. For instance, the vaporizer crucible may become contaminated after being heated for a period of time and may contribute to molecular break-ups and/or other unwanted processes. More novel types of feed materials (e.g., boranes and carborane) may be even more susceptible to contamination and therefore require an even tighter control.

Currently, however, there lacks a systematic approach to effectively and efficiently control the supply of ion source feed materials in semiconductor manufacturing environment.

In view of the foregoing, it would be desirable to provide a technique for providing ion source feed materials which overcomes the above-described inadequacies and shortcomings.

SUMMARY OF THE DISCLOSURE

Techniques for providing ion source feed materials are disclosed. In one particular exemplary embodiment, the techniques may be realized as a container for supplying an ion source feed material. The container may comprise an internal cavity to be pre-filled with an ion source feed material. The container may also comprise an outer body configured to be removably loaded into a corresponding housing that is coupled to an ion source chamber via a nozzle assembly. The container may further comprise an outlet to seal in the pre-filled ion source feed material, the outlet being further configured to engage with the nozzle assembly to establish a flow path between the internal cavity and the ion source chamber. The container may be configured to be a disposable component.

In accordance with other aspects of this particular exemplary embodiment, the container may be further configured to serve as a vaporizer crucible to heat the ion source feed material. The outer body of the container may comprise a thermally conductive material.

In accordance with further aspects of this particular exemplary embodiment, the outlet may comprise a membrane, wherein the engagement with the nozzle assembly breaks the membrane to establish the flow path.

In accordance with additional aspects of this particular exemplary embodiment, the outlet may comprise a spring-loaded valve, and wherein the engagement with the nozzle assembly causes the valve to open.

In accordance with another aspect of this particular exemplary embodiment, the feed material may be pre-filled in a non-gaseous form. The feed material may comprise carborane. Alternatively, the feed material may comprise one or more boranes. The feed material may also be pre-mixed with a hydrogen-absorbing material.

In accordance with yet another aspect of this particular exemplary embodiment, the container may further comprise a machine-readable identification that encodes information associated with a content of the container.

In another particular exemplary embodiment, the techniques may be realized as an apparatus for providing ion source feed materials. The apparatus may comprise a housing to receive a sealed container that is pre-filled with a feed material, the housing being so configured that the sealed container can be removably loaded into the housing. The apparatus may also comprise a nozzle assembly to couple the housing to an ion source chamber. The apparatus may further comprise a mechanism to engage the nozzle assembly with the container to establish a flow path between the container and the ion source chamber. In accordance with other aspects of this particular exemplary embodiment, the sealed container may comprise an outlet sealed with a membrane. The nozzle assembly may comprise a rigid member. And, the mechanism may engage the nozzle assembly with the container by causing the rigid member to pierce the membrane. The outlet of the container may be in proximity to the rigid member when the container is initially loaded into the housing, and the mechanism may cause the container to slide towards the rigid member to pierce the membrane.

In accordance with further aspects of this particular exemplary embodiment, the feed material may be pre-filled in a non-gaseous form. The feed material may comprise carborane. Alternatively, the feed material may comprise one or more boranes. The feed material may also be pre-mixed with a hydrogen-absorbing material. The apparatus may further comprise a heating mechanism to vaporize the feed material when the container is loaded into the housing and engaged with the nozzle assembly. The heating mechanism may comprise one or more heating elements in thermal contact with a crucible portion of the container.

In accordance with additional aspects of this particular exemplary embodiment, the container may be sealed with a spring-loaded valve that remains in a closed position when the container is initially loaded into the housing. The mechanism may engage the nozzle assembly with the container by depressing the spring-loaded valve to an open position.

In accordance with another aspect of this particular exemplary embodiment, the mechanism may be configured to engage the nozzle assembly with the container only when the ion source chamber has reached a predetermined vacuum level.

In accordance with yet another aspect of this particular exemplary embodiment, the container may comprise a tag encoded with computer-readable information associated with at least one of the feed material and the container. The apparatus may comprise a detector to read the computer-readable information and a processor to process the computer-readable information. The processor may be configured to reject the container if the processed computer-readable information fails to meet one or more predetermined criteria. The processor may also be configured to limit an operation of the ion source chamber based on the processed computer-readable information.

In accordance with still another aspect of this particular exemplary embodiment, the container may be labeled with at least one code that, when entered into a processor, enables or limits an operation of the ion source chamber.

In yet another particular exemplary embodiment, the techniques may be realized as an apparatus for providing ion source feed materials. The apparatus may comprise a sealed container pre-filled with a feed material. The apparatus may also comprise a housing to receive the container, the housing being so configured that the sealed container can be removably loaded into the housing. The apparatus may further comprise a nozzle assembly to couple the housing to an ion source chamber. The apparatus may additionally comprise a mechanism to engage the nozzle assembly with the container to establish a flow path between the container and the ion source chamber.

In still another particular exemplary embodiment, the techniques may be realized as a method for providing ion source feed materials. The method may comprise pre-filling a disposable container with a feed material. The method may also comprise loading the disposable container into a housing, the disposable container being sealed upon loading. The method may further comprise coupling the housing to an ion source chamber via a nozzle assembly. The method may additionally comprise engaging the nozzle assembly with the disposable container to unseal the disposable container and establish a flow path between the disposable container and the ion source chamber.

In a further particular exemplary embodiment, the techniques may be realized as an apparatus for providing ion source feed materials. The apparatus may comprise a first vaporizer assembly coupled to an ion source chamber, the first vaporizer assembly comprising a housing to detachably receive a sealed container pre-filled with a first feed material, and the first vaporizer assembly further comprising a mechanism to unseal the container to establish a first flow path between the container and the ion source chamber. The apparatus may also comprise a second vaporizer assembly coupled to the ion source chamber, the second vaporizer assembly configured to supply a second feed material to the ion source chamber via a second flow path between the container and the ion source chamber, and the second vaporizer assembly further comprising both heating and cooling elements to supply the second feed material at a substantially higher temperature than the first feed material.

In a yet further particular exemplary embodiment, the techniques may be realized as an apparatus for providing ion source feed materials. The apparatus may comprise a first vaporizer assembly coupled to an ion source chamber, the first vaporizer assembly comprising a first housing to detachably receive a first sealed container pre-filled with a first feed material, and the first vaporizer assembly further comprising a first mechanism to unseal the container to establish a first flow path between the container and the ion source chamber. The apparatus may also comprise a second vaporizer assembly coupled to the ion source chamber, the second vaporizer assembly comprising a second housing to detachably receive a second sealed container pre-filled with a second feed material, and the second vaporizer assembly further comprising a second mechanism to unseal the second container to establish a second flow path between the second container and the ion source chamber.

The present disclosure will now be described in more detail with reference to exemplary embodiments thereof as shown in the accompanying drawings. While the present disclosure is described below with reference to exemplary embodiments, it should be understood that the present disclosure is not limited thereto. Those of ordinary skill in the art having access to the teachings herein will recognize additional implementations, modifications, and embodiments, as well as other fields of use, which are within the scope of the present disclosure as described herein, and with respect to which the present disclosure may be of significant utility.

BRIEF DESCRIPTION OF THE DRAWINGS

In order to facilitate a fuller understanding of the present disclosure, reference is now made to the accompanying drawings, in which like elements are referenced with like numerals. These drawings should not be construed as limiting the present disclosure, but are intended to be exemplary only.

DETAILED DESCRIPTION OF EXEMPLARY EMBODIMENTS

Embodiments of the present disclosure provide a systematic approach for providing ion source feed materials, wherein a feed material is preferably shipped in a disposable or re-usable container. Each container may be pre-filled, sealed, and individually identified and tracked for quality and usage control. The container may be configured to be removably loaded into a vaporizer assembly. A mechanism in the vaporizer assembly may engage the container to establish a flow path into an ion source chamber. The container may serve as a crucible for a non-gaseous feed material therein. Once the inner surface of the container has degraded or the feed material depleted or expired, the used container may be replaced by a fresh one, and the used container may be discarded or recycled. A dual-supply vaporizer assembly may also be implemented to accommodate both a conventional crucible and a disposable/removable container from which a desired ion source feed gas may be selected.

In the description and the claims below, a "disposable" component refers to a component (e.g., a feed material container) that is designed or configured for cheapness and short-term convenience rather than medium to long-term durability. In some embodiments, a "disposable" component may be intended for a single use and to be discarded thereafter. In other embodiments, a "disposable" component may be re-used or recycled if, after being used, the component can be properly re-serviced or re-conditioned for another use.

Figure 1:
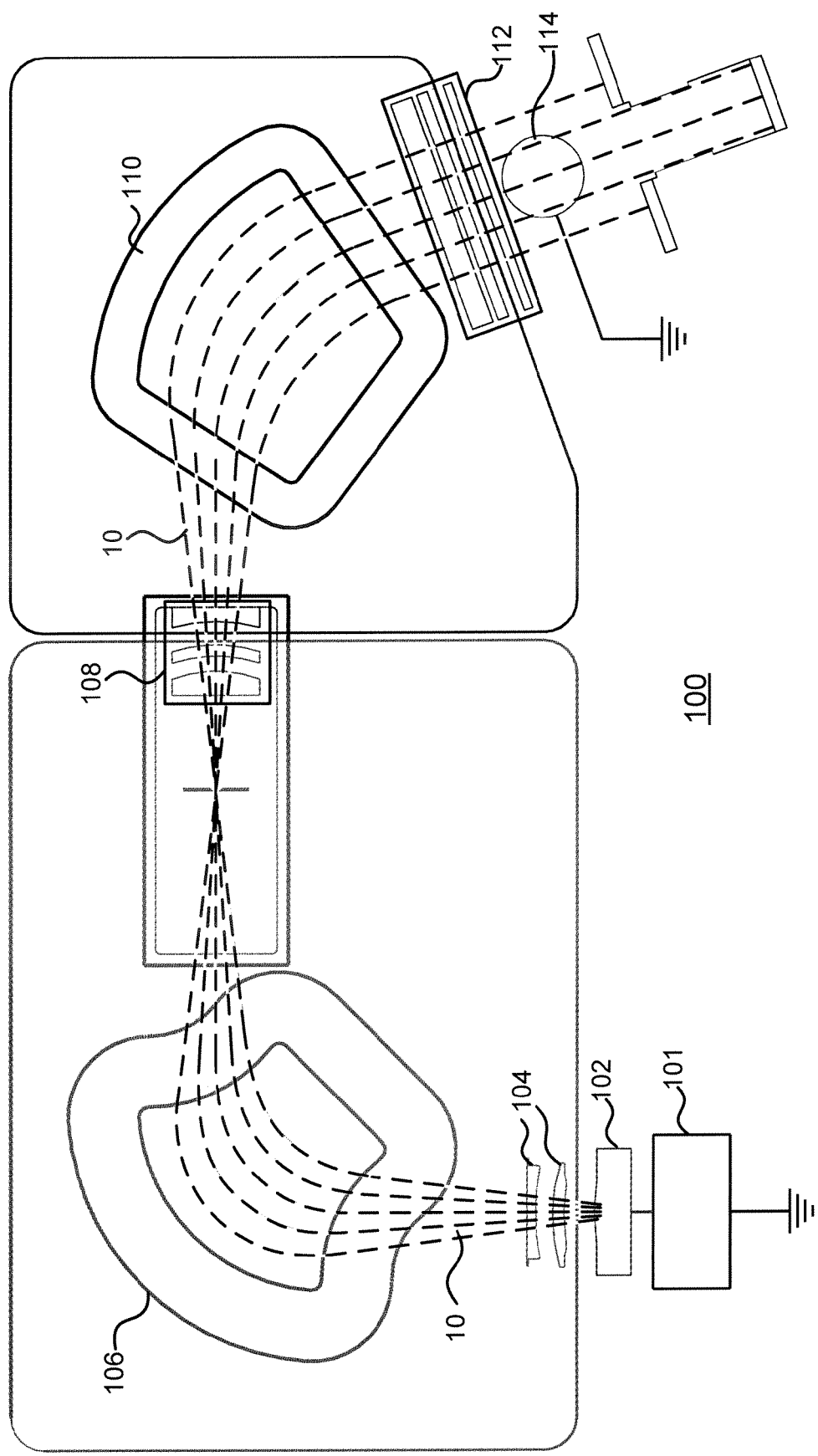
FIG. 1 shows a traditional ion implanter system.

FIG. 1 depicts an ion implanter system 100 in which the techniques for providing ion source feed materials may be implemented in accordance with embodiments of the present disclosure. As is typical for most ion implanter systems, the system 100 is housed in a high-vacuum environment. The ion implanter system 100 may comprise an ion source 102, biased to a potential by a power supply 101. The ion source 102 is typically contained in a vacuum chamber known as a source housing (not shown). The ion implanter system 100 may also comprise a complex series of beam-line components through which an ion beam 10 passes. The series of beam-line components may include, for example, extraction electrodes 104, a 90° magnet analyzer 106, a first deceleration (D1) stage 108, a 70° magnet collimator 110, and a second deceleration (D2) stage 112. Much like a series of optical lenses that manipulate a light beam, the beam-line components can filter and focus the ion beam 10 before steering it towards a target wafer. During ion implantation, the target wafer is typically mounted on a platen 114 that can be moved in one or more dimensions (e.g., translate, rotate, and tilt) by an apparatus, sometimes referred to as a "roplat."

Figure 2:
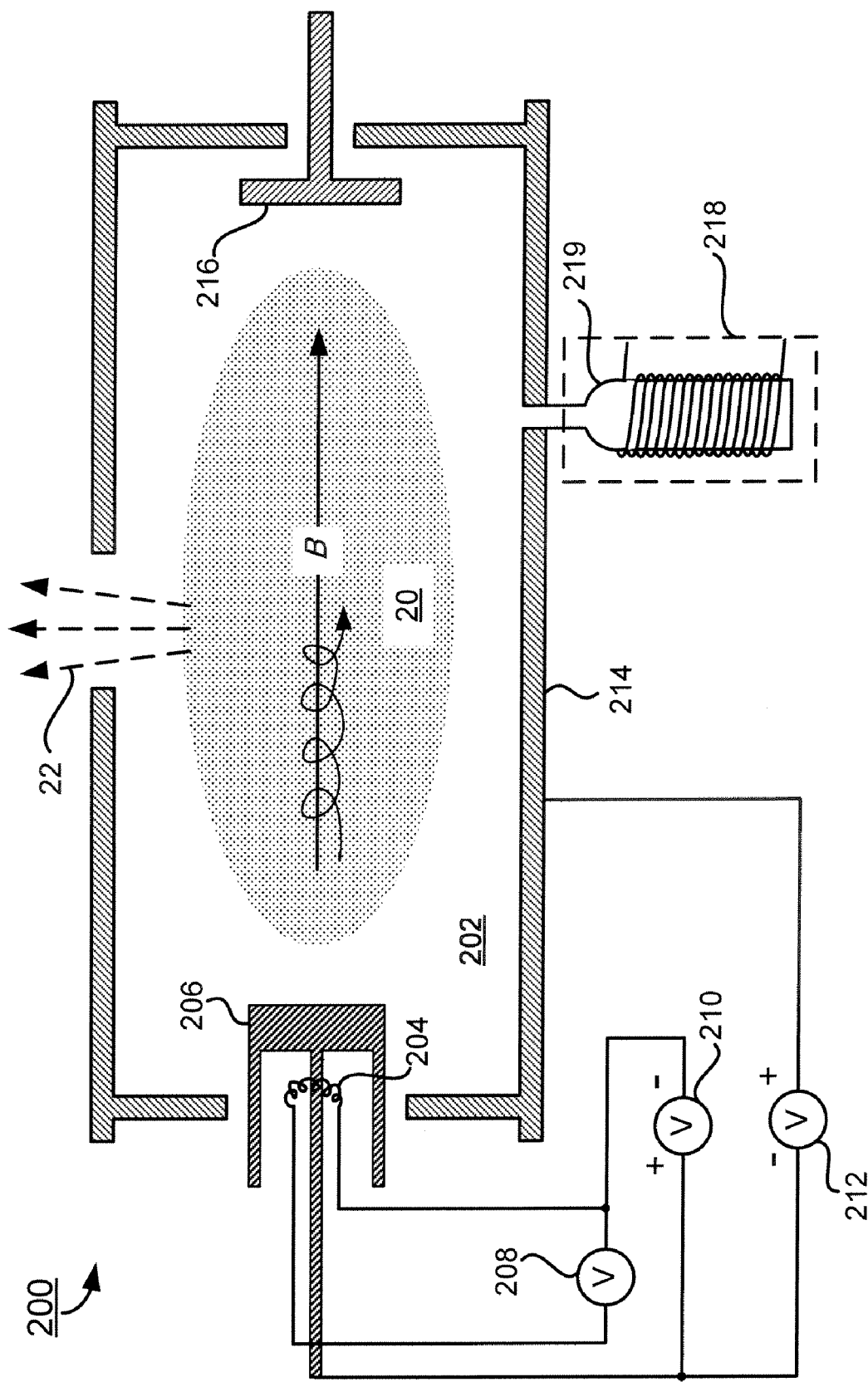
FIG. 2 shows a traditional IHC ion source in an ion implanter.

FIG. 2 shows an indirectly heated cathode (IHC) ion source 200 to which ion source feed materials may be supplied in accordance with embodiments of the present disclosure. The ion source 200 comprises an arc chamber 202 with conductive chamber walls 214. At one end of the arc chamber 202 there is a cathode 206 having a tungsten filament 204 located therein. The tungsten filament 204 is coupled to a first power supply 208 capable of supplying a high current. The high current may heat the tungsten filament 204 to cause thermionic emission of electrons. A second power supply 210 may bias the cathode 206 at a much higher potential than the tungsten filament 204 to cause the emitted electrons to accelerate to the cathode and thus heat up the cathode 206. The heated cathode 206 may then emit electrons into the arc chamber 202. A third power supply 212 may bias the chamber walls 214 with respect to the cathode 206 so that the electrons are accelerated at a high energy into the arc chamber. A source magnet (not shown) may create a magnetic field B inside the arc chamber 202 to confine the energetic electrons, and a repeller 216 at the other end of the arc chamber 202 may be biased at a same or similar potential as the cathode 206 to repel the energetic electrons.

A vaporizer assembly 218 may supply a feed gas (e.g., carborane) into the arc chamber 202. The vaporizer assembly 218 may typically comprise a vaporizer 219 that heats up one or more feed materials and supplies the resultant feed gas to the arc chamber 202. The energetic electrons may interact with the reactive species to produce a plasma 20. An extraction electrode (not shown) may then extract ions 22 from the plasma 20 for use in the ion implanter, for example, as illustrated in FIG. 1.

Notwithstanding the illustrations in FIGS. 1 and 2, it should be noted that the techniques for providing ion source feed materials, as disclosed herein, are not limited to beam-line ion implanters, but are also applicable to other types of ion implanters such as those used for plasma doping (PLAD) or plasma immersion ion implantation (PIII). Nor are the techniques limited to IHC-type ion sources, but are applicable to other types of ion sources such as Bernas-type, Freeman-type, electron-impact type, or even radio frequency (RF) or microwave powered ion sources.

Figure 3:
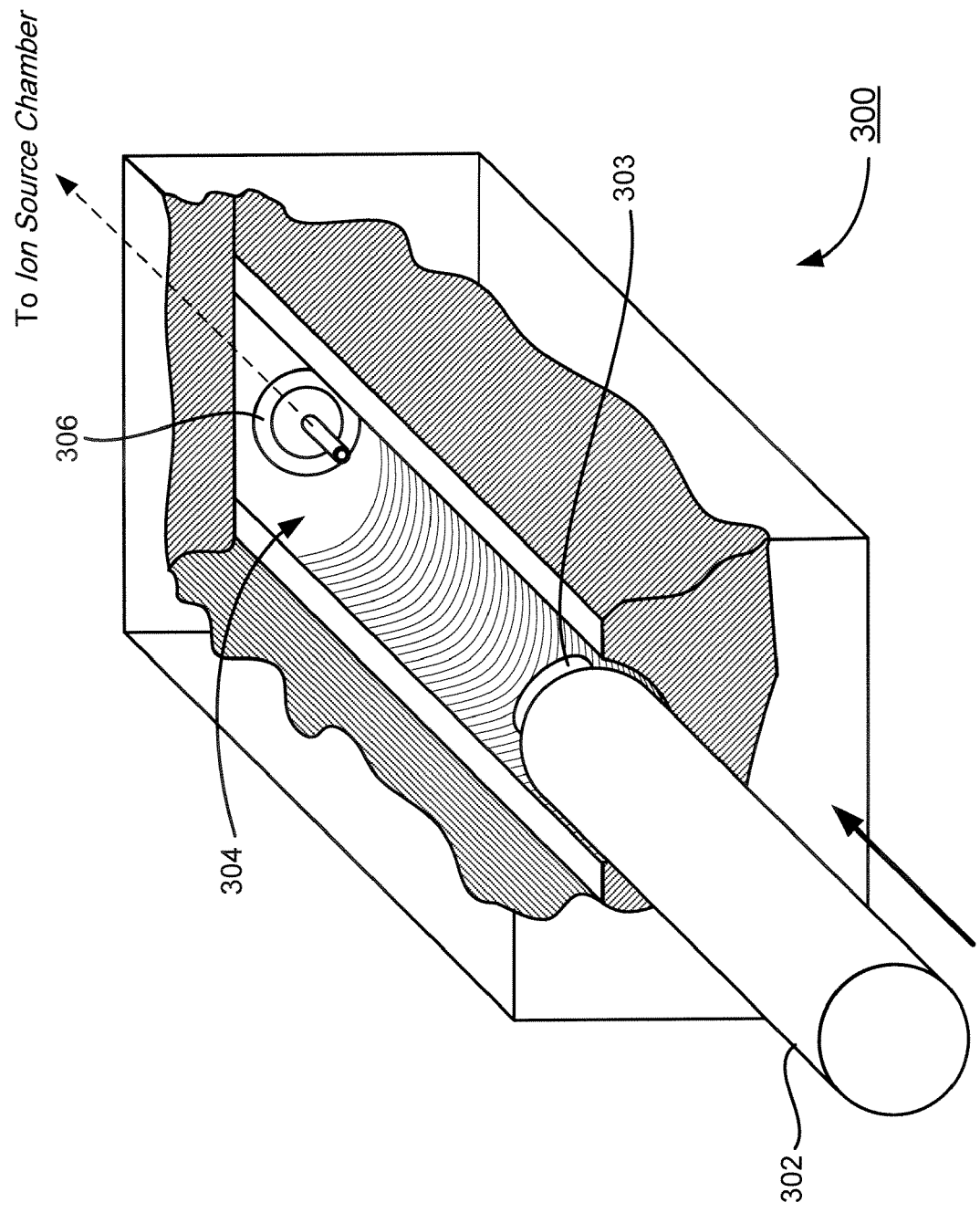
FIG. 3 shows an exemplary system for providing ion source feed materials in accordance with an embodiment of the present disclosure.

FIG. 3 shows an exemplary system 300 for providing ion source feed materials in accordance with an embodiment of the present disclosure. The system 300 may comprise a container 302 and a corresponding housing 304 adapted to receive the container 302.

The container 302 may be a disposable canister made of a metal or composite material that is thermally conductive. The container 302 may be pre-filled with a feed material and sealed during transportation and storage. The feed material may be mixed with one or more pre-fillers or additives. According to one embodiment of the present disclosure, the feed material may be pre-mixed with a hydrogen-absorbing material. The container 302 may comprise an outlet 303 that is sealed with, for example, a membrane or a valve.

The housing 304 may be so configured that the container 302 can be detachably or removably loaded into the housing 304. Preferably, the container 302 may be loaded from one end of the housing 304 and slid into a "load" position. On the other end of the housing 304, there may be a nozzle assembly 306 that is coupled to an ion source chamber (not shown) such as an arc chamber or plasma chamber of an ion source. When in the "load" position, the outlet 303 of the container 302 may be in close proximity to the nozzle assembly 306. The nozzle assembly 306 may be configured to engage with the sealed container 302 to unseal the container 302 and to couple with the outlet 303 to establish a flow path between the container 302 and the ion source chamber. A number of mechanisms may be implemented to engage the nozzle assembly 306 with the container 302, such as a load-and-pierce configuration shown in FIGS. 4 and 5 or a spring-loaded valve shown in FIG. 7.

The housing 304 may also comprise a heating mechanism (not shown) that is in thermal contact with the container 302. Thus, for a non-gaseous feed material therein, the container 302 may also serve as a vaporizer crucible which is heated by the heating mechanism to convert the non-gaseous feed material into a feed gas. The feed gas may then be supplied to the ion source chamber via the flow path established with the nozzle assembly 306. It may be desirable to maximize the thermal contact between the container 302 and the heating mechanism. For example, a tight fit between the container 302 and the housing 304 is desirable to achieve a maximum thermal conduction. According to one embodiment, it may be advantageous to fill any gap between the container 302 and the sidewalls of the housing 304 with a gas to increase or adjust thermal conductivity to the container 302. According to another embodiment, a vacuum compatible thermal compound or similar material may be used to fill the gap between the container 302 and the sidewalls of the housing 304. Alternatively, the heating mechanism or a heating surface may be brought into direct contact with the container 302 once it has been loaded and locked in place. For instance, a pressure exerted on the bottom of the container 302 may cause a small amount of lateral expansion of the sidewalls of the container 302, thereby increasing thermal contact with the sidewalls of the housing 304.

Preferably, the container 302 may bear one or more identification tags or codes that helps track the usage and quality of the container 302 and any content therein. For example, the container 302 may comprise an electronic or magnetic tag (not shown), such as an radio-frequency identification device (RFID), which carries computer-readable information associated with the container 302 and/or the feed material therein. Optionally, the computer-readable information may be password-protected. Alternatively, the container 302 may have one or more optically readable indicia such as a laser-scribed or printed dotcode or bar code. According to one embodiment, an arbitrary, two-dimensional pattern and an identification code may be generated for each container, wherein the pattern and the code are paired in one-to-one correspondence by means of an algorithm. With the identification tags and/or codes, each container 302 and its content may be identified and tracked for quality and usage control.

The system 300 may further comprise one or more components (not shown) to detect and process the computer-readable or optically-readable information in order to determine whether the container 302 and its content meet predetermined criteria and therefore are suitable for ion generation. If unsuitable, the container 302 may be automatically rejected. For example, the ion source or ion implanter into which the container 302 is loaded may refuse to start if it is decided that the container 302 or its content do not meet a minimum standard. The detection and authentication of the computer-readable or optically-readable information may be performed on a periodic or continuous basis. The methodology of identification, encoding, detection and authentication is not limited to the quality or usage control of ion source feed materials. Rather, this methodology is equally applicable to the tracking and control of other components and materials related to ion sources, ion implanters, and other semiconductor manufacturing equipment.

The container 302 may be rejected and replaced with a fresh container of feed material under one or more of the following circumstances: (1) the feed material in the container 302 has been depleted; (2) the feed material in the container 302 has expired; (3) the interior surface of the container 302 has degraded (e.g., after one or more heating processes or a predetermined temperature-hours); or (4) the container 302 has somehow been unsealed before engagement with the nozzle assembly 306. Then, the used container 302 may be either discarded or returned to the supplier of the feed material to be recycled or reused (e.g., re-serviced and re-filled). A re-filled container 302 may bear a new tag or the old tag with updated information.

Figure 4:
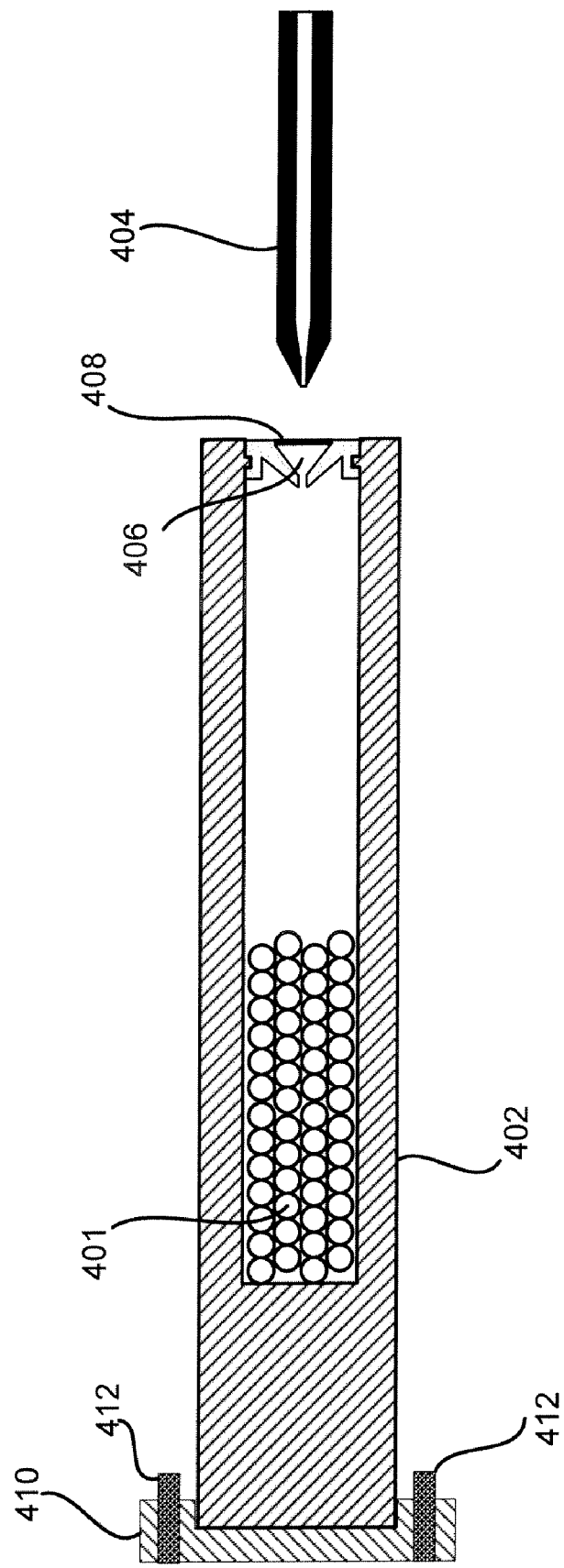
FIG. 4 shows an exemplary load-and-pierce container and an exemplary nozzle in accordance with an embodiment of the present disclosure.

FIG. 4 shows an exemplary load-and-pierce container 402 and an exemplary nozzle 404 in accordance with an embodiment of the present disclosure. The container 402 may be a disposable component having an internal cavity pre-filled with a feed material 401. An outlet 406 of the container 402 may be sealed with a membrane 408. On the other end of the container 402, there may be a cover plate 410 and screws 412 that fasten the container 402 in place when it is loaded into a vaporizer assembly such as the system 300 as illustrated in FIG. 3. The nozzle 404 may have a rigid, pointed tip that can pierce the membrane 408 to unseal the container 402. Optionally, the tip of the nozzle 404 may be shaped to mate with the outlet 406 of the container 402. According to one exemplary design, a piece of gas-permeable filtering material, such as rock wool, may be placed in or near the nozzle 404 to prevent the feed material 401 from sliding out of the container 402, for example, during unloading or servicing.

In operation, the container 402 may be first loaded into a vaporizer assembly and secured in place by the cover plate 410 and the screws 412. In the "load" position, the membrane 408 may be in proximity to the pointed tip of the nozzle 404. To engage the nozzle 404 with the container 402, the container 402 may be pushed or slid towards the nozzle 404 to bring it in contact with the membrane 408 and then the outlet 406. For example, further tightening of the screws 412 may push the container 402 forward to engage with the nozzle 404. The nozzle 404, mated with the outlet 406, may then provide a flow path from the interior of the container 402 to the other end of the nozzle 404 which is typically coupled to an ion source chamber (not shown).

Figure 5:
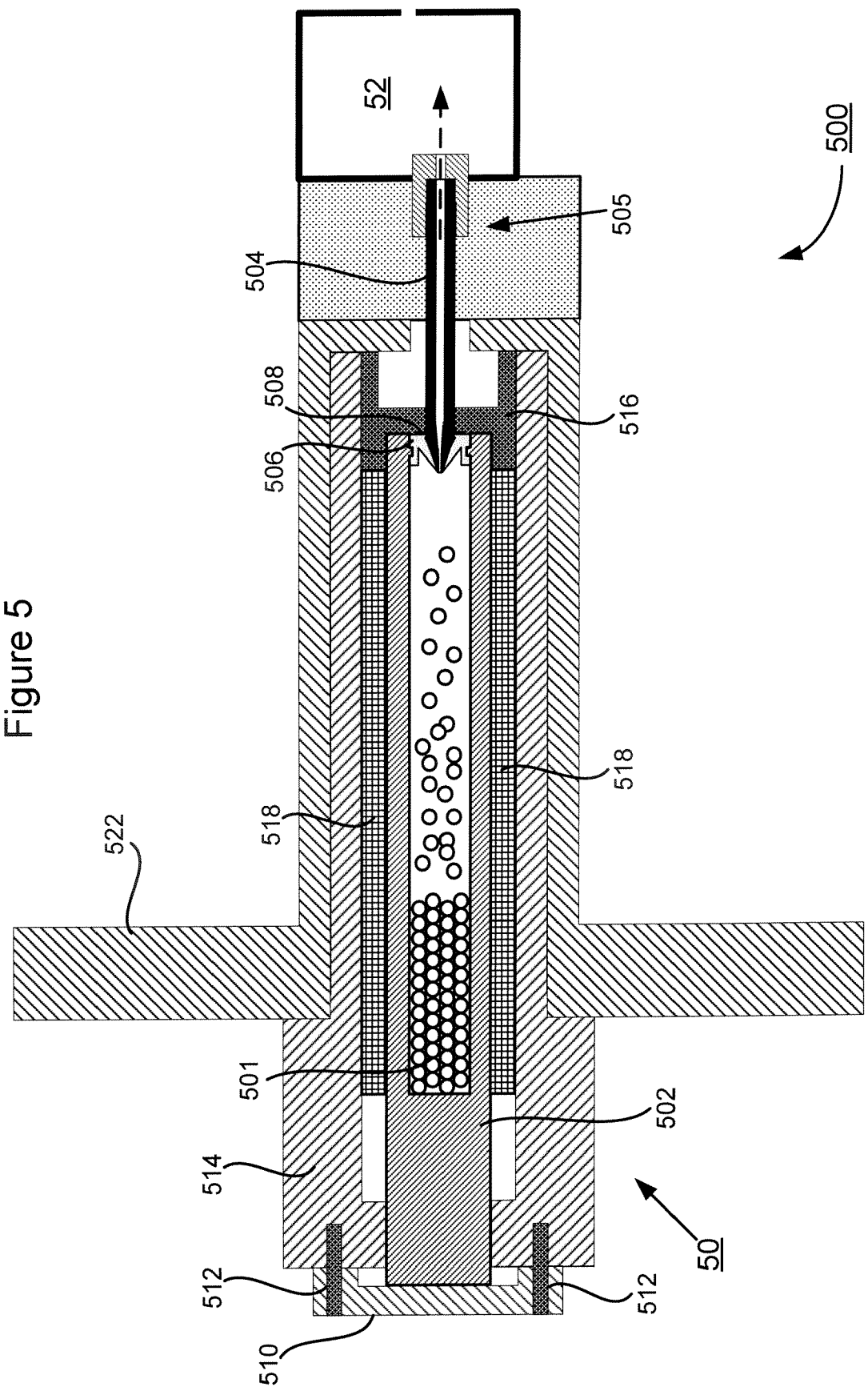
FIG. 5 shows an exemplary ion source assembly in accordance with an embodiment of the present disclosure.

FIG. 5 shows an exemplary ion source assembly 500 comprising a vaporizer assembly 50 and an ion source 52 in accordance with an embodiment of the present disclosure. The vaporizer assembly 50 may have a load-and-pierce container 502 loaded therein. The container 502 may be the same as or similar to the container 402 shown in FIG. 4. The container 502 may comprise an outlet 506 originally sealed by a membrane 508. Here, the membrane 508 has been pierced by a nozzle 504 which is part of a nozzle assembly 505. The nozzle assembly 505 may be further coupled to the ion source 52. The nozzle 504 may be mated with the outlet 506 to establish a flow path from the container 502 to the ion source 52.

The container 502 may be loaded in a housing 514. On the left end of the housing 514, a cover plate 510 and screws 512 may secure the container 502 in the "load" position and to help engage the container 502 with the nozzle 504. A vacuum O-ring (not shown) may be used between the cover plate 510 and the housing 514 to ensure a proper seal. On the right end of the housing 514, a plug 516 may provide thermal isolation for the container 502. One or more heating elements 518 may wrap around a portion of the container 502 ("crucible portion") to heat up a feed material 501 therein. The housing 514 may be further fastened to a support plate 522 to which the ion source 52 is also attached. With this modular arrangement, the container 502 may be easily removed or replaced, the housing 514 may be detached from the support plate 522 for servicing, and the entire ion source assembly 500 may be removed from an ion implanter for servicing.

The operation of the vaporizer assembly 50 may be controlled electronically. For example, as mentioned above, a detection unit (not shown) may read information from an RFID tag (not shown) on the container 502, and a processor unit (not shown) may process the information to make operational decisions. In addition, the engagement of the nozzle 504 with the container 502 may be conditioned upon a pressure in the ion source 52 (or its housing) reaching a predetermined level (e.g., rough vacuum). For instance, to minimize contamination of certain sensitive feed materials pre-filled and sealed in the container 502, a pressure sensor (not shown) in or near the ion source 52 may provide pressure data to the processor unit which only allows the membrane 508 to be pierced when the pressure is sufficiently low.

Figure 6:
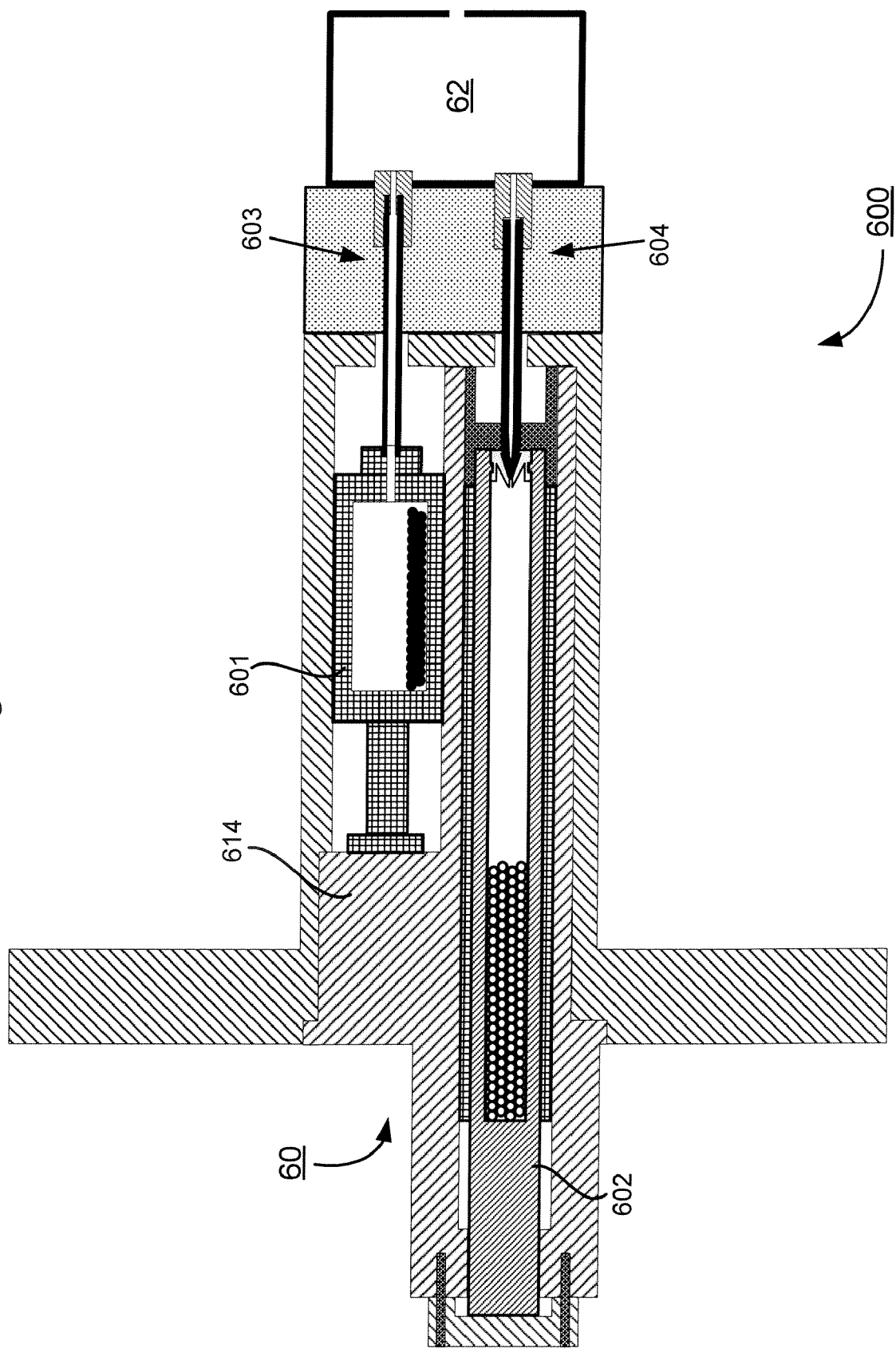
FIG. 6 shows another exemplary ion source assembly in accordance with an embodiment of the present disclosure.

FIG. 6 shows another exemplary ion source assembly 600 in accordance with an embodiment of the present disclosure. The ion source assembly 600 may comprise a dual-supply vaporizer assembly 60 and an ion source 62. The dual-supply vaporizer assembly 60 may comprise a conventional crucible 601 to supply conventional feed materials (e.g., phosphorous, gallium, indium, antimony and arsenic) and a disposable container 602 to supply more exotic feed materials (e.g., boron-containing molecules such as carborane). The conventional feed materials may require relatively less stringent control than the exotic feed materials.

The conventional crucible 601 may be relatively fixed in the vaporizer assembly 60 and may be coupled to the ion source 62 via a first nozzle assembly 603. The disposable container 602 may be a load-and-pierce type that is the same as or similar to the containers 402 and 502 shown in FIGS. 4 and 5 respectively. The disposable container 602 may be coupled to the ion source 62 via a second nozzle assembly 604. Either or both sources of feed gases may be selected by heating the corresponding feed material container(s) in the dual-supply vaporizer assembly 60.

The conventional crucible 601 may be attached to a housing and support component 614 that also separates the conventional crucible 601 from the disposable container 602. The housing and support component 614 may have cooling channels (not shown) therein to circulate a coolant (e.g., water), which, together with heating elements, may provide temperature control and/or desired thermal isolation for the dual-supply vaporizer assembly 60.

Figure 7:
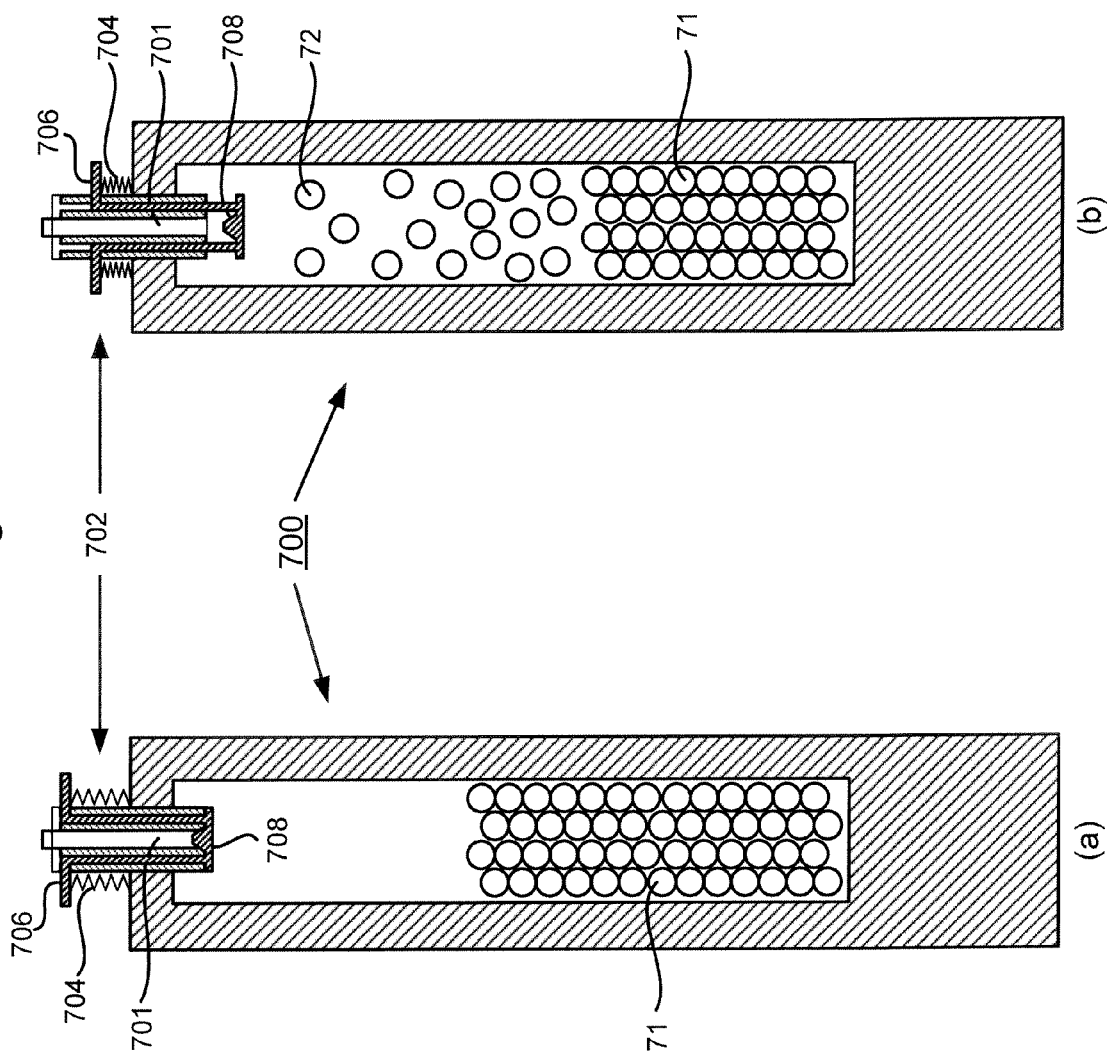
FIG. 7 shows an alternative design of an exemplary container for providing ion source feed materials in accordance with an embodiment of the present disclosure.

FIG. 7 shows an alternative design of an exemplary container 700 for providing ion source feed materials in accordance with an embodiment of the present disclosure. The container 700 may be pre-filled with a feed material 71. The container 700 may comprise a spring-loaded valve assembly 702 that seals an outlet 701 of the container 700. The valve assembly 702 may include a spring 704 and a pressure plate 706 attached to the spring 704. When the container 700 is being stored or transported, or when the container 700 is initially loaded into a vaporizer assembly, the valve assembly 702 may be in a closed position as shown in FIG. 7a. The pressure plate 706 may be lifted up by the spring 704 to cause a plug 708 to seal the outlet 701.

When the container 700 is engaged with a nozzle assembly (not shown), a rigid member in the nozzle assembly may depress the pressure plate 706, such that the plug 708 is disengaged from the outlet 701. The valve assembly 702 is then in an open position, as shown in the FIG. 7b, which allows a feed gas 72 (generated from the feed material 71) to escape from the container 700. In various embodiments, a bracket, spring, clip or other mechanical restraining device may push against a bottom portion of the container 700 to bias the valve assembly 702 to keep it open.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

The invention claimed is:

1. A container for supplying an ion source feed material, the container comprising:
    an internal cavity to be pre-filled with an ion source feed material;
    an outer body configured to be removably loaded into a corresponding housing that is coupled to an ion source chamber via a nozzle assembly; and
    an outlet to seal in the ion source feed material, the outlet being further configured to engage with the nozzle assembly to establish a flow path between the internal cavity and the ion source chamber, wherein the outlet comprises a membrane, and wherein the engagement with the nozzle assembly breaks the membrane to establish the flow path;
    wherein the container is configured to be a disposable component.

2. The container according to claim 1 being further configured to serve as a vaporizer crucible to heat the ion source feed material.

3. The container according to claim 2, wherein the outer body comprises a thermally conductive material.

4. The container according to claim 1, wherein the ion source feed material is pre-filled in a non-gaseous form.

5. The container according to claim 4, wherein the ion source feed material comprises carborane.

6. The container according to claim 4, wherein the ion source feed material comprises one or more boranes.

7. The container according to claim 4, wherein the ion source feed material is pre-mixed with a hydrogen-absorbing material.

8. The container according to claim 1, further comprising a machine-readable identification that encodes information associated with a content of the container.

9. An apparatus for providing ion source feed materials, the apparatus comprising:
    a housing to receive a container that is sealed and pre-filled with a feed material, the housing being so configured that the sealed container can be removably loaded into the housing, the sealed container comprising an outlet sealed with a membrane;
    a nozzle assembly to couple the housing to an ion source chamber; and
    a mechanism to engage the nozzle assembly with the outlet to establish a flow path between the container and the ion source chamber.

10. The apparatus according to claim 9, wherein:
    the nozzle assembly comprises a rigid member; and
    the mechanism engages the nozzle assembly with the container by causing the rigid member to pierce the membrane.

11. The apparatus according to claim 10, wherein:
    the outlet of the container is in proximity to the rigid member when the container is initially loaded into the housing; and
    the mechanism causes the container to slide towards the rigid member to pierce the membrane.

12. The apparatus according to claim 9, wherein the feed material is pre-filled in the container in a non-gaseous form.

13. The apparatus according to claim 12, wherein the feed material comprises carborane.

14. The apparatus according to claim 12, wherein the feed material is pre-mixed with a hydrogen-absorbing material.

15. The apparatus according to claim 12, further comprising:
  a heating mechanism to vaporize the feed material when the container is loaded into the housing and engaged with the nozzle assembly.

16. The apparatus according to claim 15, wherein the heating mechanism comprises one or more heating elements in thermal contact with a crucible portion of the container.

17. The apparatus according to claim 9, wherein the mechanism is configured to engage the nozzle assembly with the container only when the ion source chamber has reached a predetermined vacuum level.

18. The apparatus according to claim 9, wherein the container comprises a tag encoded with computer-readable information associated with at least one of the feed material and the container.

19. The apparatus according to claim 18, further comprising:
  a detector to read the computer-readable information; and
  a processor to process the computer-readable information.

20. The apparatus according to claim 19, wherein the processor is configured to reject the container if the computer-readable information fails to meet one or more predetermined criteria.

21. The apparatus according to claim 19, wherein the processor is configured to limit an operation of the ion source chamber based on the computer-readable information.

22. The apparatus according to claim 9, wherein the container is labeled with at least one code that, when entered into a processor, enables or limits an operation of the ion source chamber.

23. An apparatus for providing ion source feed materials, the apparatus comprising:
  a container pre-filled with a feed material;
  a housing to receive the container, the housing being so configured that the sealed container can be removably loaded into the housing;
  a nozzle assembly to couple the housing to an ion source chamber; and
  a mechanism comprising a membrane to engage the nozzle assembly with the container to establish a flow path between the container and the ion source chamber, wherein the nozzle assembly is configured to pierce the membrane.

24. A method for providing ion source feed materials, the method comprising the steps of:
  pre-filling a disposable container with a feed material;
  loading the disposable container into a housing, the disposable container being sealed upon loading using a membrane;
  coupling the housing to an ion source chamber via a nozzle assembly; and
  engaging the nozzle assembly with the disposable container to unseal the disposable container and establish a flow path between the disposable container and the ion source chamber by piercing the membrane.

25. An apparatus for providing ion source feed materials, the apparatus comprising:
  a first vaporizer assembly coupled to an ion source chamber, the first vaporizer assembly comprising a housing to detachably receive a container that is sealed and pre-filled with a first feed material, and the first vaporizer assembly further comprising a mechanism to unseal the container to establish a first flow path between the container and the ion source chamber; and
  a second vaporizer assembly coupled to the ion source chamber, the second vaporizer assembly configured to supply a second feed material to the ion source chamber via a second flow path between a second container and the ion source chamber, and the second vaporizer assembly further comprising both heating and cooling elements to supply the second feed material at a substantially higher temperature than the first feed material.

26. The apparatus according to claim 25, further comprising:
  a selection mechanism to cause at least one of the first feed material and the second feed material to be supplied to the ion source chamber.

27. An apparatus for providing ion source feed materials, the apparatus comprising:
  a first vaporizer assembly coupled to an ion source chamber, the first vaporizer assembly comprising a first housing to detachably receive a first container that is sealed and pre-filled with a first feed material, and the first vaporizer assembly further comprising a first mechanism to unseal the first container to establish a first flow path between the first container and the ion source chamber; and
  a second vaporizer assembly coupled to the ion source chamber, the second vaporizer assembly comprising a second housing to detachably receive a second container that is sealed and pre-filled with a second feed material, and the second vaporizer assembly further comprising a second mechanism to unseal the second container to establish a second flow path between the second container and the ion source chamber.

* * * * *